(12) United States Patent
Wu et al.

(10) Patent No.: US 8,945,797 B2
(45) Date of Patent: Feb. 3, 2015

(54) MASK, PATTERN DISPOSING METHOD THEREOF AND EXPOSING METHOD THEREOF

(71) Applicant: Macronix International Co., Ltd., Hsinchu (TW)

(72) Inventors: Shih-Rung Wu, New Taipei (TW); Shao-Wei Hsieh, Hsinchu County (TW)

(73) Assignee: Macronix International Co., Ltd., Hsinchu (TW)

( * ) Notice: Subject to any disclaimer, the term of this patent is extended or adjusted under 35 U.S.C. 154(b) by 109 days.

(21) Appl. No.: 13/742,382

(22) Filed: Jan. 16, 2013

(65) Prior Publication Data
US 2013/0209923 A1    Aug. 15, 2013

(30) Foreign Application Priority Data
Feb. 10, 2012    (TW) .............................. 101104433 A

(51) Int. Cl.
*G03F 1/68*    (2012.01)
*G03F 7/20*    (2006.01)
(52) U.S. Cl.
CPC ................ *G03F 7/2022* (2013.01); *G03F 1/68* (2013.01)
USPC ............................................. 430/5; 430/394

(58) Field of Classification Search
USPC ......................... 430/5, 322, 323, 394; 716/55
See application file for complete search history.

(56) References Cited

U.S. PATENT DOCUMENTS

2010/0153905 A1*    6/2010    Maeda ........................... 716/21

FOREIGN PATENT DOCUMENTS

TW    200521594 A    7/2005

OTHER PUBLICATIONS

TW Office Action dated Sep. 10, 2014.

* cited by examiner

*Primary Examiner* — Stephen Rosasco
(74) *Attorney, Agent, or Firm* — McClure, Qualey & Rodack, LLP

(57) ABSTRACT

A mask, a pattern disposing method thereof and an exposing method thereof are provided. A plurality of geometric patterns are arranged on the mask along a plurality of columns. The arrangement of the patterns arranged along odd columns is similar to that of the patterns arranged along even columns. Two odd columns or two even columns are selected to be a first edge column and a second edge column respectively. At each corresponding position of the first edge column and the second edge column, only one of the first edge column and the second edge column is selected to be disposed one geometric pattern.

15 Claims, 4 Drawing Sheets

MASK, PATTERN DISPOSING METHOD THEREOF AND EXPOSING METHOD THEREOF

This application claims the benefit of Taiwan application Serial No. 101104433, filed Feb. 10, 2012, the subject matter of which is incorporated herein by reference.

BACKGROUND

1. Technical Field

The disclosure relates in general to a mask, a pattern disposing method thereof and an exposing method thereof, and more particularly to a mask comprising a plurality of geometric patterns regularly arranged, a pattern disposing method thereof and an exposing method thereof.

2. Description of the Related Art

With the development of semiconductor technology, varied semiconductor elements are invented. In the manufacturing process of the semiconductor element, exposure and development are important steps.

In an exposure step, a mask is used for blocking some energy light to project on a photoresister layer, such that the photoresister layer can be developed some pattern. In some case, the exposure step is needed to be performed repeatedly. The exposed patterns can be engaged to form a complete pattern. However, in the exposure step, the variation of movement and alignment of the mask, and the diffraction of the light might affect the accuracy of the engagement. Therefore, how to engage the exposed patterns becomes a bottleneck in the development of the semiconductor technology.

SUMMARY

The disclosure is directed to a mask, a pattern disposing method thereof and an exposing method thereof. A step of selecting patterns and a step of overlapped exposing are used, such that the exposed patterns can be smoothly engaged.

According to a first aspect of the present disclosure, a pattern disposing method of a mask is provided. The pattern disposing method comprises the following step. A plurality of geometric patterns are arranged on a base along a plurality of columns. The arrangement of the patterns arranged along odd columns is similar to that of the patterns arranged along even columns. Two odd columns or two even columns are selected to be a first edge column and a second edge column respectively. Only one of the first edge column and the second edge column is selected to be disposed one geometric pattern at each corresponding position of the first edge column and the second edge column.

According to a second aspect of the present disclosure, an exposing method of a mask is provided. The exposing method comprises the following steps. A mask having a base and a plurality of geometric patterns is provided. The geometric patterns are arranged on the base along a plurality of columns. The arrangement of the patterns arranged along odd columns is similar to that of the patterns arranged along even columns. The mask has a first edge column and a second edge column. Only one of the first edge column and the second edge column is selected to be disposed one geometric pattern at each corresponding position of the first edge column and the second edge column. A substrate is repeatedly exposed. The first edge column is partially overlapped with the second edge column which is previously exposed.

According to a third aspect of the present disclosure, a mask is provided. The mask comprises a base and a plurality of geometric patterns. The geometric patterns are arranged on the base along a plurality of columns. The arrangement of the patterns arranged along odd columns is similar to that of the patterns arranged along even columns. The mask has a first edge column and a second edge column. Only one of the first edge column and the second edge column is selected to be disposed one geometric pattern at each corresponding position of the first edge column and the second edge column.

The above and other aspects of the disclosure will become better understood with regard to the following detailed description of the non-limiting embodiment(s). The following description is made with reference to the accompanying drawings.

DETAILED DESCRIPTION

Preferred embodiments are disclosed below for elaborating the invention. A step of selecting patterns and a step of overlapped exposing are used, such that the exposed patterns can be smoothly engaged. The following embodiments are for the purpose of elaboration only, not for limiting the scope of protection of the invention. Besides, secondary elements are omitted in the following embodiments to highlight the technical features of the invention.

First Embodiment

Figure 1:
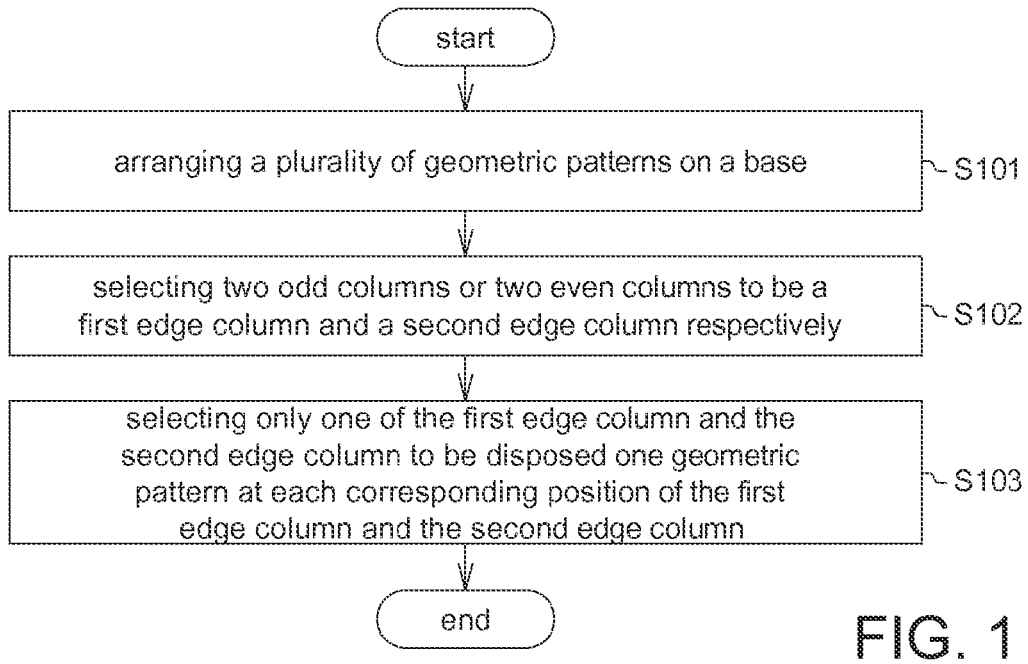
FIG. 1 shows a flow chart of a pattern disposing method of a mask.
Figure 2:
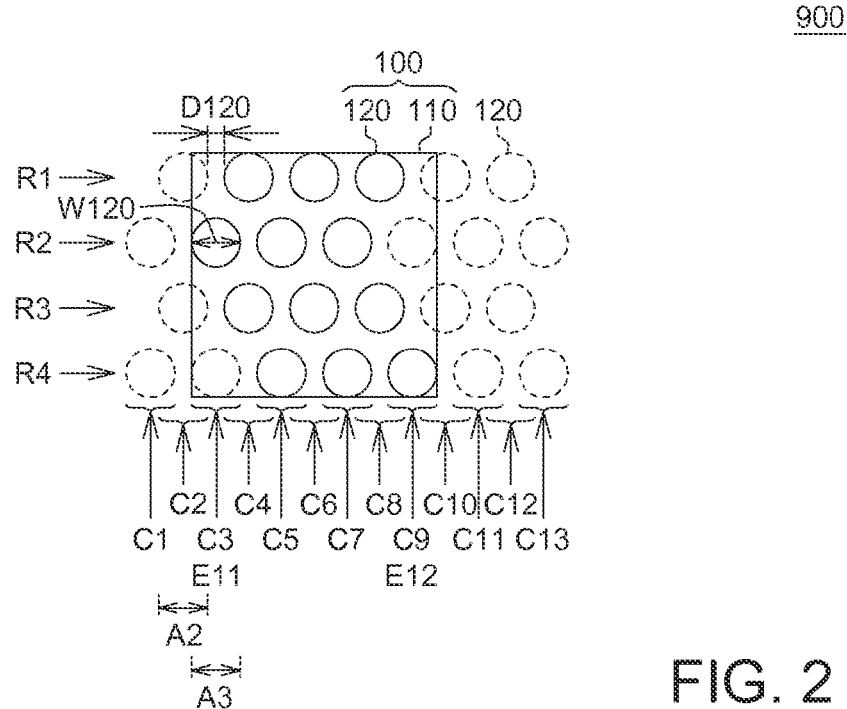
FIGS. 2 to 3 show each step of FIG. 1.
Figure 3:
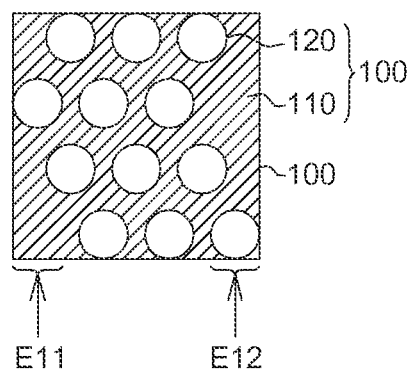

Please referring to FIGS. 1 to 3, FIG. 1 shows a flow chart of a pattern disposing method of a mask 100, and FIGS. 2 to 3 show each step of FIG. 1. In the pattern disposing method of the mask 100, it is needed to be considered firstly that the arrangement of a predetermined pattern 900 to be exposed. As shown in FIG. 2, in step S101, a plurality of geometric pattern 120 are arranged on a base 110 along a plurality of columns. The arrangements of the geometric patterns 120 arranged in the odd columns are similar. As shown in FIG. 2, the geometric patterns 120 arranged in columns C1, C3, C5, C7, C9, C11 and C13 are arranged at rows R2 and R4. The arrangements of the geometric patterns 120 arranged in the even columns are similar. As shown in FIG. 2, the geometric patterns 120 arranged in columns C2, C4, C6, C8, C10 and C12 are arranged at rows R1 and R3.

The geometric patterns 120 are identical and are regularly arranged to form the predetermined pattern 900 with large size.

However, the size of the exposing apparatus is usually small, thus the predetermined pattern 900 is needed to be cut to provide the mask 100 with small size. The patterns exposed by the mask 100 are engaged to from the predetermined pattern 900 with large size.

As shown in FIG. 2, a distance D120 between two geometric patterns 120 of two adjacent columns is smaller then a width W120 of each geometric pattern 120. That is to say, there is an overlapped region on the areas of the two adjacent columns. Take columns C2 and C3 as an example, there is an overlapped region on the area A2 of column C2 and the area A3 of column C3. Because the geometric patterns 120 in column C2 are located at rows R1 and R3, the geometric patterns 120 in column C3 are located at rows R2 and R4, the geometric patterns 120 which are located in column C2 will not overlapped with the geometric patterns 120 which are located in column C3.

If the predetermined pattern 900 is directly cut, some geometric pattern 120 will be cut, since there is an overlapped region on the areas of the two adjacent columns. The geometric patterns 120 which are cut are not easy to be engaged well. In the present embodiment, the geometric patterns 120 are disposing by the following steps to solve this problem.

In step S102, two odd columns or two even columns, such as columns C3 and C9, are selected to be a first edge column E11 and a second edge column E12 respectively.

In step S103, only one of the first edge column E1 and the second edge column E2 is selected to be disposed one geometric pattern 120 at each corresponding position of the first edge column E1 and the second edge column E2. For example, as shown in FIG. 2, there are two corresponding positions, i.e. rows R1 and R2, in the first edge column E11 and the second edge column E12. At row R1, only the first edge column E11 is selected to be disposed one geometric pattern 120; but at row R1, there is no geometric pattern 120 disposed in the second edge column E12. At row R3, only the second edge column E12 is selected to be disposed one geometric pattern 120; but at row R3, there is no geometric pattern 120 disposed in the first edge column E11.

In the present embodiment, the first edge column E11 and the second edge column E12 are randomly selected to be disposed the geometric patterns 120 at all of the corresponding positions of the first edge column E11 and the second edge column E12. The geometric patterns 120 are not only disposed in the first edge column E11 and are not only disposed in the second edge column E12.

Furthermore, the geometric pattern 120 disposed in the first edge column E11 is a complete pattern, and the geometric pattern 120 disposed in the second edge column E12 is a complete pattern. Therefore, during the step of exposing is performed, there is no needed to engage any incomplete geometric pattern 120 to be a single geometric pattern 120.

As shown in FIG. 3, the mask 100 formed by the pattern disposing method described above includes the base 110 and the plurality of geometric patterns 120. The geometric patterns 120 are arranged on the base 110 along a plurality of columns. The arrangements of the geometric patterns 120 arranged in the odd columns are similar. The arrangements of the geometric patterns 120 in even columns are similar. Only one of the first edge column E11 and the second edge column E12 to be disposed one geometric pattern 120 at each corresponding position of the first edge column E11 and the second edge column E12.

Figure 4:
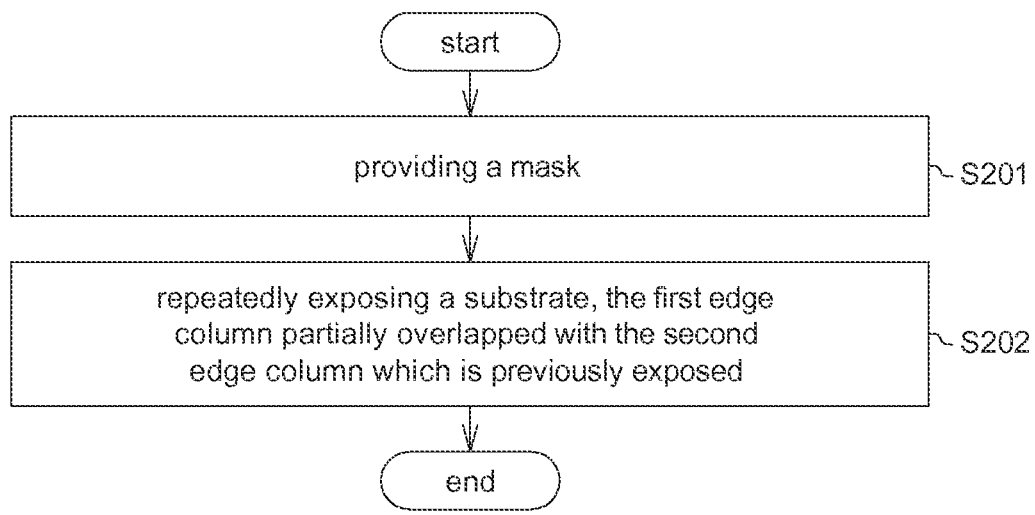
FIG. 4 shows a flow chart of an exposing method of the mask.

Please refer to FIG. 4, which shows a flow chart of an exposing method of the mask 100. The mask 100 which is formed by the pattern disposing method described above is used for performing the step of exposing, such that the exposed patterns can be smoothly engaged.

In step S201, as shown in FIG. 3, the mask 100 is provided. The empty regions where the geometric patterns 120 are located are transparent. The regions marked oblique lines are non-transparent. When an energy light projects on the mask 100, the energy light can pass through the geometric patterns 120, such that the geometric patterns 120 can be transferred to a substrate.

Figure 5:
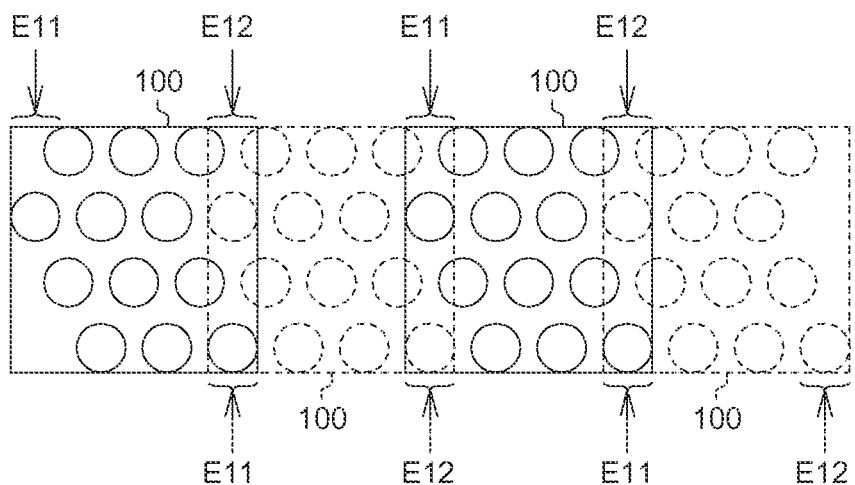
FIG. 5 shows the step of overlapped exposing by the mask.

Please refer to FIG. 5, which shows the step of overlapped exposing by the mask 100. In the step S202, the substrate is repeatedly exposed by the mask 100. As shown in FIG. 5, from left to right, the mask 100 which is firstly used is shown by a full line, the mask 100 which is secondly used is shown by a dotted line, the mask 100 which is thirdly used is shown by a full line, the mask 100 which is fourthly used is shown by a dotted line, and so on. The first edge column E11 which is secondly exposed is overlapped with the second edge column E12 which is firstly exposed, the first edge column E11 which is thirdly exposed is overlapped with the second edge column E12 which is secondly exposed, the first edge column E11 which is fourthly exposed is overlapped with the secondly edge column E12 which is thirdly exposed, and so on.

Through the pattern disposing method and the exposing method described above, even if there is an aligning error during the step of exposing, all of the geometric patterns 120 are complete patterns in each step of exposing. There is no need to engage any incomplete pattern to form a single geometric pattern 120. Moreover, there might be a rounding phenomenon at the engaged line. Through the pattern disposing method and the exposing method described above, the rounding phenomenon will not result any problem.

Second Embodiment

Figure 6:
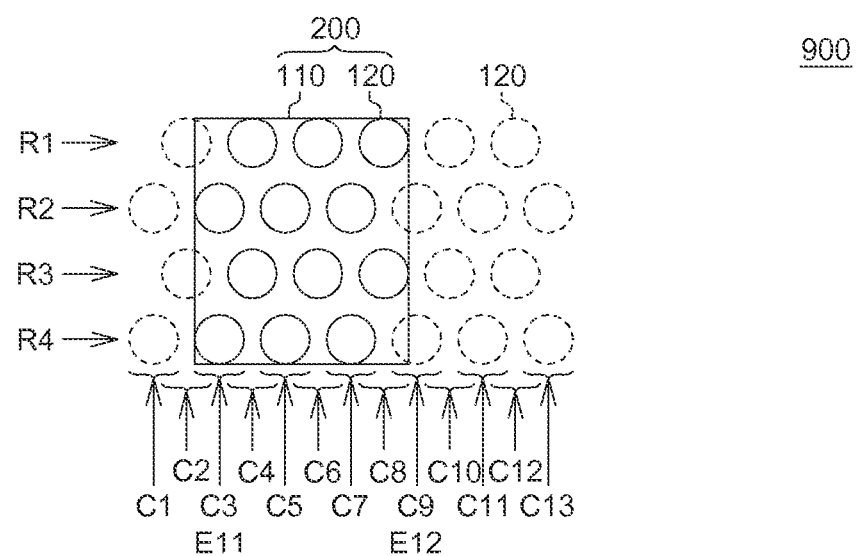
FIGS. 6 to 7 show each step of FIG. 1.
Figure 7:
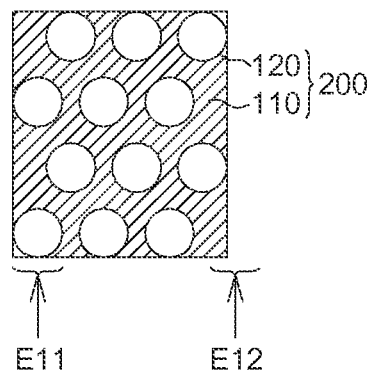

Please refer to FIGS. 6 to 7, which show each step of FIG. 1. A mask 200, a pattern disposing method thereof and an exposing method thereof of the present embodiment is different from that of the first embodiment in the selection method in the step S103, other similarities are not repeated.

In step S103, the first edge column E11 is selected to be disposed the geometric patterns 120 at all of the corresponding positions of the first edge column E11 and the second edge column E12. For example, as shown in FIG. 6, there are two corresponding positions, i.e. rows R2 and R4, in the first edge column E11 and the second edge column E12. At row R2, only the first edge column E11 is selected to be disposed one geometric pattern 120; but at row R2, there is no geometric pattern 120 disposed in the second edge column E12. At row R4, only the first edge column E11 is selected to be disposed one geometric pattern 120; but at row R4, there is no geometric pattern 120 disposed in the second edge column E12.

As shown in FIG. 6, all of the geometric patterns 120 in the second edge column E12 are not selected. The edge of the mask 200 can be shifted to the region of the column C8.

Figure 8:
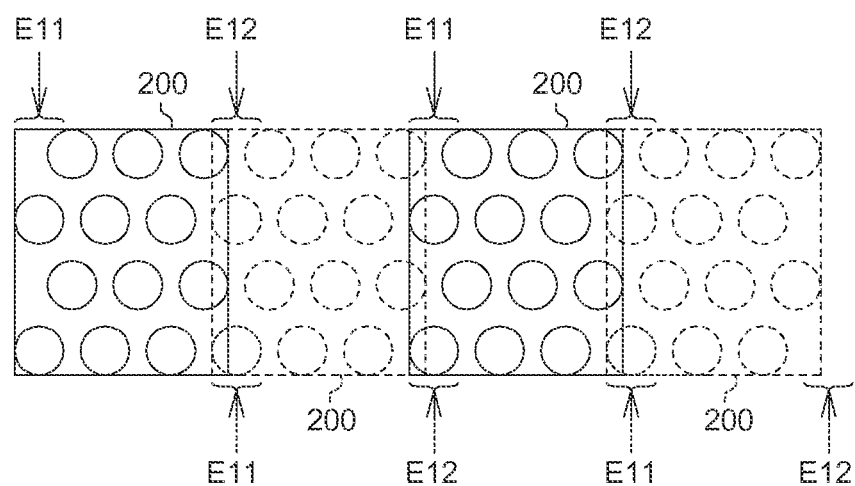
FIG. 8 shows the step of overlapped exposing by the mask.

Please refer to the mask 200 which is formed by the pattern method describe above. The mask 200 can be used in the step of overlapped exposing for smoothly engaging the exposed patterns to from the predetermined pattern 900. As shown in FIG. 8, from left to right, the mask 200 which is firstly used is shown by a full line, the mask 200 which is secondly used is shown by a dotted line, the mask 200 which is thirdly used is shown by a full line, the mask 200 which is fourthly used is shown by a dotted line, and so on. The first edge column E11 which is secondly exposed is overlapped with the second edge column E12 which is firstly exposed, the first edge column E11 which is thirdly exposed is overlapped with the second edge column E12 which is secondly exposed, the first edge column E11 which is fourthly exposed is overlapped with the second edge column E12 which is thirdly exposed, and so on.

In the present embodiment, only the first edge column E11 is selected to be disposed the geometric pattern 120, not only the size of the mask 200 can be reduced, but also the overlapped region during the step of exposing can be reduced.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A pattern disposing method of a mask, comprises:
arranging a plurality of geometric patterns on a base along a plurality of columns, wherein a plurality of arrangements of the patterns arranged along odd columns are similar, and a plurality of arrangements of the patterns arranged along even columns are similar;
selecting two odd columns or two even columns to be a first edge column and a second edge column respectively; and
selecting only one of the first edge column and the second edge column to be disposed one geometric pattern at each corresponding position of the first edge column and the second edge column.

2. The pattern disposing method according to claim 1, wherein the first edge column is selected to be disposed the geometric patterns at all of the corresponding positions of the first edge column and the second edge column.

3. The pattern disposing method according to claim 1, wherein the first edge column and the second edge column are randomly selected to be disposed the geometric patterns at all of the corresponding positions of the first edge column and the second edge column.

4. The pattern disposing method according to claim 1, wherein the geometric patterns are substantially identical.

5. The pattern disposing method according to claim 1, wherein a distance between two geometric patterns of two adjunct columns is smaller than a width of each geometric pattern.

6. An exposing method of a mask, comprising:
providing a mask having a base and a plurality of geometric patterns, wherein the geometric patterns are arranged on the base along a plurality of columns, a plurality of arrangements of the patterns arranged along odd columns are similar, a plurality of arrangements of the patterns arranged along even columns are similar, the mask has a first edge column and a second edge column, and only one of the first edge column and the second edge column is selected to be disposed one geometric pattern at each corresponding position of the first edge column and the second edge column; and
repeatedly exposing a substrate, wherein the first edge column is partially overlapped with the second edge column which is previously exposed.

7. The exposing method according to claim 6, wherein the first edge column is selected to be disposed the geometric patterns at all of the corresponding positions of the first edge column and the second edge column.

8. The exposing method according to claim 6, wherein the first edge column and the second edge column are randomly selected to be disposed the geometric patterns at all of the corresponding positions of the first edge column and the second edge column.

9. The exposing method according to claim 6, wherein the geometric patterns are substantially identical.

10. The exposing method according to claim 6, wherein a distance between two geometric patterns of two adjunct columns is smaller than a width of each geometric pattern.

11. A mask, comprising:
a base; and
a plurality of geometric patterns, arranged on the base along a plurality of columns, wherein a plurality of arrangements of the patterns arranged along odd columns are similar, and a plurality of arrangements of the patterns arranged along even columns are similar;
wherein, the mask has a first edge column and a second edge column, and only one of the first edge column and the second edge column is selected to be disposed one geometric pattern at each corresponding position of the first edge column and the second edge column.

12. The mask according to claim 11, wherein the first edge column is selected to be disposed the geometric patterns at all of the corresponding positions of the first edge column and the second edge column.

13. The mask according to claim 11, wherein the first edge column and the second edge column are randomly selected to be disposed the geometric patterns at all of the corresponding positions of the first edge column and the second edge column.

14. The mask according to claim 11, wherein the geometric patterns are substantially identical.

15. The mask according to claim 11, wherein a distance between two geometric patterns of two adjunct columns is smaller than a width of each geometric pattern.

* * * * *